(12) United States Patent
Park (10) Patent No.: US 6,960,504 B2
(45) Date of Patent: Nov. 1, 2005

(54) METHOD FOR FABRICATING CAPACITOR

(75) Inventor: Jong-Bum Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 96 days.

(21) Appl. No.: 10/615,087

(22) Filed: Jul. 9, 2003

(65) Prior Publication Data

US 2004/0126982 A1 Jul. 1, 2004

(30) Foreign Application Priority Data

Dec. 30, 2002 (KR) .................................. 10-2002-0086394

(51) Int. Cl.$^7$ ........................................... H01L 21/8242
(52) U.S. Cl. ..................................... 438/253; 438/396
(58) Field of Search ............................... 438/253, 254, 438/255, 256, 396, 397, 398, 399, 239, 250

(56) References Cited

U.S. PATENT DOCUMENTS

| | | | | |
|---|---|---|---|---|
| 6,429,087 B2 | * | 8/2002 | Kwok et al. ................. | 438/381 |
| 6,696,721 B2 | * | 2/2004 | Hieda ......................... | 257/306 |
| 6,706,607 B2 | * | 3/2004 | Park et al. .................. | 438/393 |
| 6,743,672 B2 | * | 6/2004 | Park ........................... | 438/253 |
| 2001/0039084 A1 | * | 11/2001 | Cho et al. ................... | 438/238 |
| 2002/0057548 A1 | * | 5/2002 | Crenshaw et al. .......... | 361/302 |
| 2002/0168847 A1 | * | 11/2002 | Narwankar et al. ......... | 438/635 |
| 2003/0020138 A1 | * | 1/2003 | Zheng ......................... | 257/534 |
| 2003/0030093 A1 | * | 2/2003 | Agarwal al. ................ | 257/306 |
| 2003/0153145 A1 | * | 8/2003 | Sandhu et al. ............. | 438/239 |
| 2004/0005788 A1 | * | 1/2004 | Gonzalez et al. ........... | 438/776 |
| 2004/0126982 A1 | * | 7/2004 | Park ........................... | 438/396 |
| 2004/0145057 A1 | * | 7/2004 | Choi ........................... | 257/758 |

* cited by examiner

*Primary Examiner*—M. Wilczewski
(74) *Attorney, Agent, or Firm*—Mayer, Brown, Rowe & Maw LLP

(57) ABSTRACT

The present invention is related to a method for fabricating a capacitor capable of preventing a contact between neighboring lower electrodes even if a height of the lower electrode increases. The lower electrode is formed to have a critical dimension wider at a bottom region than at a top region to thereby be firmly supported. Also, a wider distance between the lower electrodes prevents neighboring lower electrodes from contacting to each other. As a result of these effects, it is possible to prevent a failure of dual bit, which eventually results in higher yields of semiconductor devices.

17 Claims, 7 Drawing Sheets

METHOD FOR FABRICATING CAPACITOR

FIELD OF THE INVENTION

The present invention relates to a method for fabricating a semiconductor device; and, more particularly, to a method for fabricating a capacitor.

DESCRIPTION OF RELATED ARTS

Because of recent trends in large-scale integration, minimization and high-speed operation in a semiconductor device, a capacitor area has been progressively decreased. Even if the semiconductor device is highly integrated and minimized, it is mandated to secure a capacitor capacitance for driving the semiconductor device.

For one approach to secure the capacitor capacitance, a lower electrode of the capacitor is formed in various types of structure including a cylinder structure, a stack structure, a concave structure and so on so that an effective surface area of the lower electrode of the capacitor can be maximized. Also, a height of the lower electrode is increased to secure the capacitor capacitance.

FIGS. 1A to 1D are cross-sectional views showing a conventional method for fabricating a capacitor.

Figure 1A:
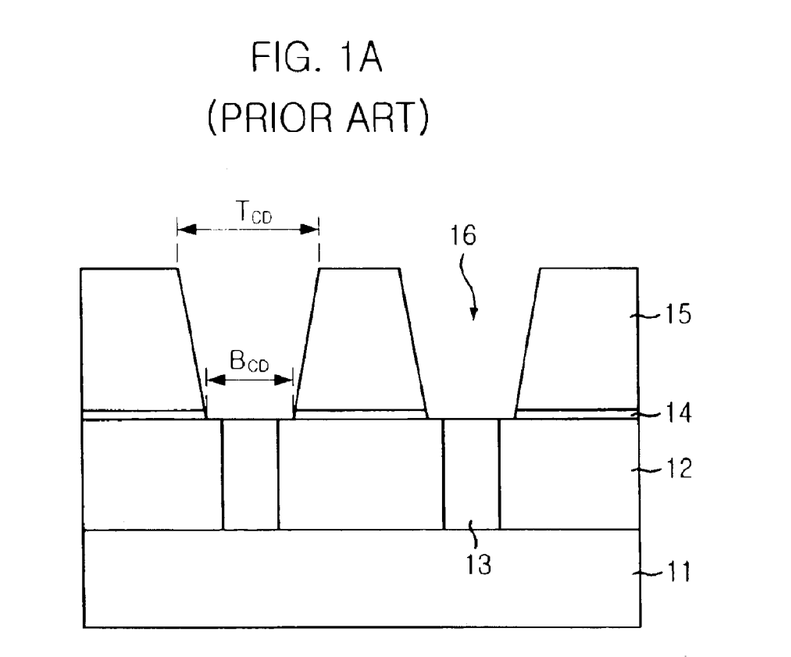
FIGS. 1A to 1D are cross-sectional views showing a conventional method for fabricating a capacitor.

Referring to FIG. 1A, an inter-layer insulation layer 12 is formed on a substrate 11 in which semiconductor circuits including a transistor and a bit line are formed. The inter-layer insulation layer 12 is then etched to form storage node contact holes exposing partial portions of the substrate 11.

Next, each storage node contact hole is buried to form a storage node contact plug 13 connected to the substrate 11. On top of the inter-layer insulation layer 12 including the storage node contact plugs 13, an etch barrier layer 14 and a storage node oxide layer 15 determining a height of a subsequent lower electrode 17 shown in FIG. 1B are sequentially deposited.

The etch barrier layer 14 and the storage node oxide layer 15 are etched to form a lower electrode 17 region, for instance, a concave pattern 16. At this time, the concave pattern 16 is formed by performing a dry etching process to the thick storage node oxide layer 15. The concave pattern 16 has an etch profile that is not vertical, and this fact results that a critical dimension of a top region ($T_{CD}$) is wider than that of a bottom region ($B_{CD}$). Hereinafter, the critical dimension is referred to as CD.

Figure 1B:
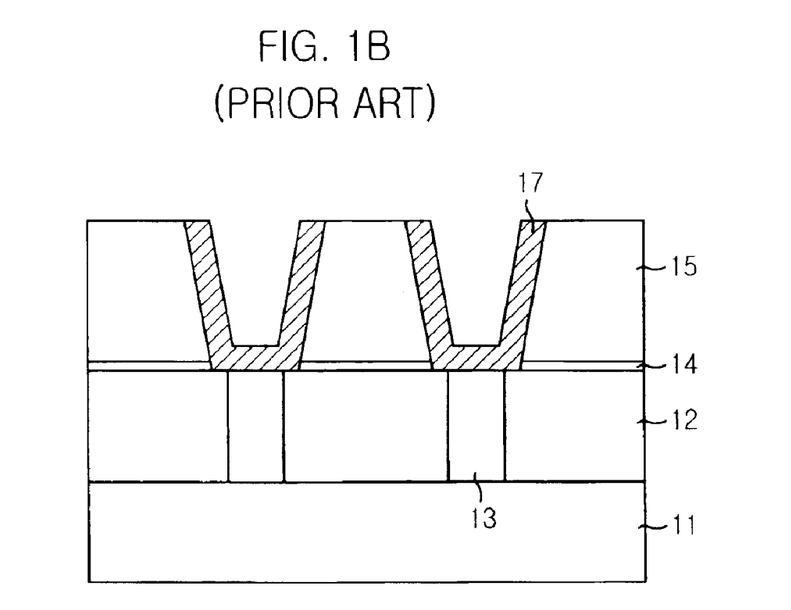

Referring to FIG. 1B, a conductive layer for the lower electrode 17 (hereinafter referred to as lower electrode conductive layer) is deposited on an entire surface of the structure including the concave pattern 16, and a photosensitive layer is coated on the lower electrode conductive layer until filling up the concave pattern 16. Subsequent to the photosensitive layer coating, the lower electrode conductive layer formed at regions except for the concave pattern 16 is removed through an etch-back process or a chemical mechanical polishing (CMP) process to form the lower electrode 17 having a cylinder structure. After the lower electrode 17 formation, the photosensitive layer is removed.

Figure 1C:
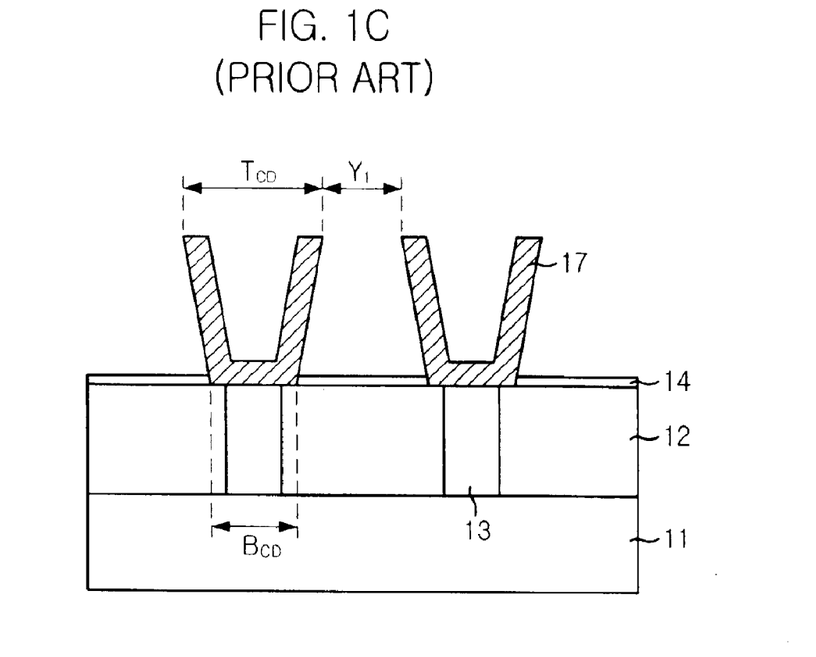

Referring to FIG. 1C, the storage node oxide layer 15 is removed through a wet dip-out process. At this time, the exposed lower electrode 17 having the cylinder structure has a wider CD at a top region ($T_{CD}$) than at a bottom region ($B_{CD}$) As a result of this unequal CD, a distance $Y_1$ between the lower electrodes 17 gets narrower.

Figure 1D:
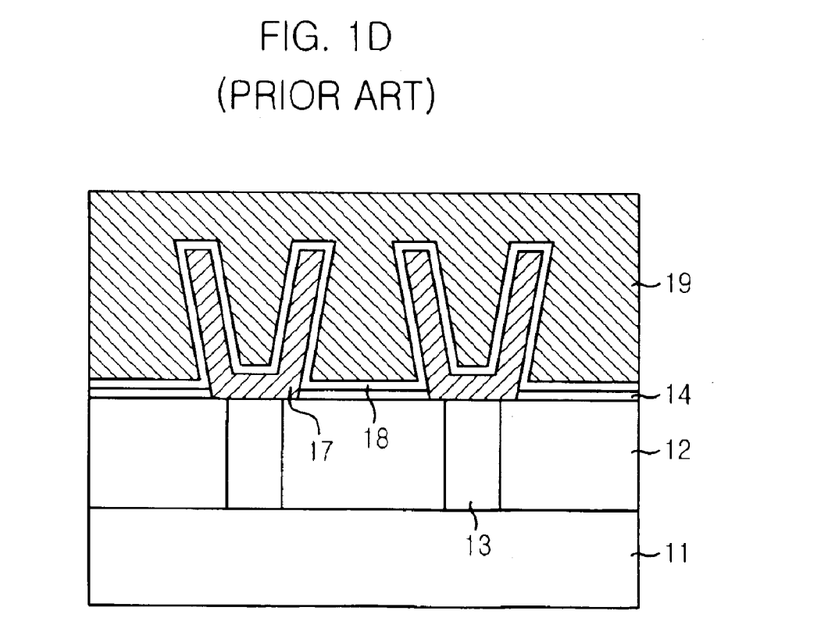

Thereafter, as shown in FIG. 1D, a dielectric layer 18 and an upper electrode 19 are sequentially formed on the lower electrode 17 to thereby form a capacitor.

Figure 2:
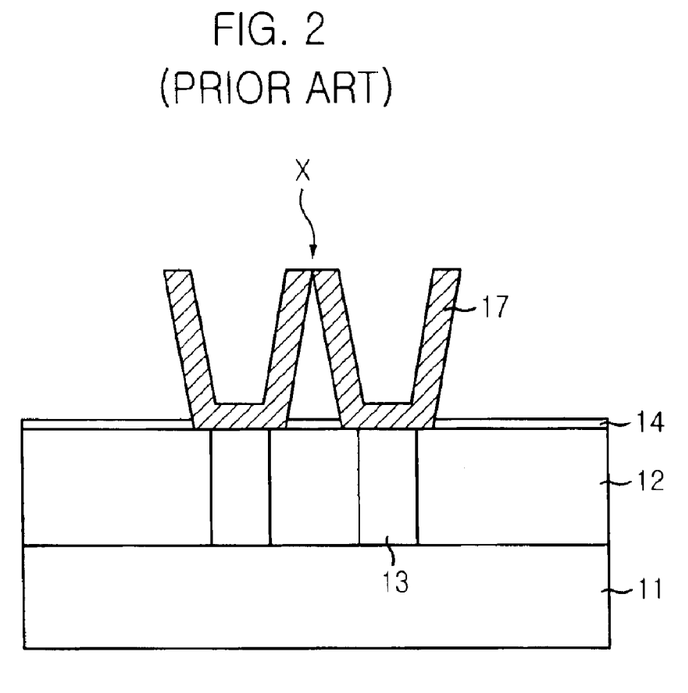
FIG. 2 is a diagram illustrating a problem of contacts made between neighboring lower electrodes arising in the conventional method.

However, as shown in FIG. 2, the above-described method has a disadvantage that the neighboring lower electrodes cannot be supported in a right position and is consequently contacted to each other owing to a fact that the lower electrode 17 has the wider CD at the top region ($T_{CD}$) than at the bottom region ($B_{CD}$). This case of contacting neighboring lower electrodes 17 to each other includes a dual bit failure, which results in a further failure of independent operations for each cell.

SUMMARY OF THE INVENTION

It is, therefore, an object of the present invention to provide a method for fabricating a capacitor capable of preventing a contact between neighboring lower electrodes even if a height of the lower electrode increases.

In accordance with an aspect of the present invention, there is provided a method for fabricating a capacitor, including the steps of: forming a stack layer sequentially deposited in an order of an inter-layer insulation layer and a first etch barrier layer on a substrate, wherein a hole exposing a partial portion of the substrate passing through the inter-layer insulation layer and the first etch barrier layer is formed; forming a storage node contact plug contacted to the partial portion of the substrate by being buried into the hole; forming a storage node insulation layer on the stack layer, the storage node insulation layer having a concave pattern of which bottom region has a wider critical dimension (CD) than that of a top region and exposing the storage node contact plug; forming a lower electrode inside of the concave pattern, the lower electrode being connected to the storage node contact plug; and forming sequentially a dielectric layer and an upper electrode on the lower electrode.

In accordance with another aspect of the present invention, there is also provided a method for fabricating a capacitor, including the steps of: forming a stack layer by depositing sequentially an inter-layer insulation layer and a first etch barrier layer on a substrate; forming a storage node contact hole exposing a partial portion of the substrate by etching the stack layer; forming a storage node contact plug connected to the substrate by being buried into the storage node contact hole; depositing a second etch barrier layer and a first storage node insulation layer on the storage node contact plug and the stack layer; performing a dry etching process to the first storage node insulation layer and the second etch barrier layer to form a pillar-type pattern of which bottom region has a wider critical dimension (CD) than that of a top region on the storage node contact plug; forming a second storage node insulation layer encompassing the pillar-type pattern; removing selectively the pillar-type pattern to form a concave pattern exposing the storage node contact plug; forming a lower electrode inside of the concave pattern, the lower electrode being connected to the storage node contact plug and having a wider critical dimension at its bottom region than at its top region; and forming sequentially a dielectric layer and an upper electrode on the lower electrode.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, an inventive method for forming a capacitor will be described in more detail.

Figure 3A:
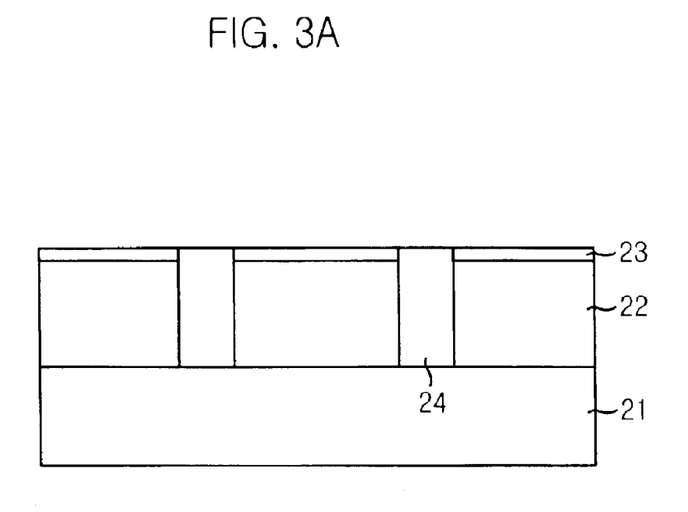
FIGS. 3A to 3H are cross-sectional views showing a method for fabricating a capacitor in accordance with a preferred embodiment of the present invention.

Referring to FIG. 3A, an inter-layer insulation layer 22 and a first etch barrier layer 23 are deposited on a substrate 21 in which semiconductor circuits including a transistor and a bit line are formed. At this time, the first etch barrier layer 23 is a nitride layer deposited to a thickness in a range from about 300 Å to about 1000 Å. The first etch barrier layer 23 functions as a barrier layer against a subsequent dry etching process and a barrier layer against a subsequent wet etching process performed to a first storage node insulation layer 26.

Then, a mask and etch process is used to etch the first etch barrier layer 23 and the inter-layer insulation layer 22 to form storage node contact holes exposing partial portions of the substrate 21, and a polysilicon layer is deposited on the first etch barrier layer 23 until the storage node contact holes are filled up.

The polysilicon layer is planarized with use of a chemical mechanical polishing (CMP) process until exposing a surface of the first etch barrier layer 23. After the planarization, a storage node contact plug 24 made of the polysilicon layer is formed.

Figure 3B:
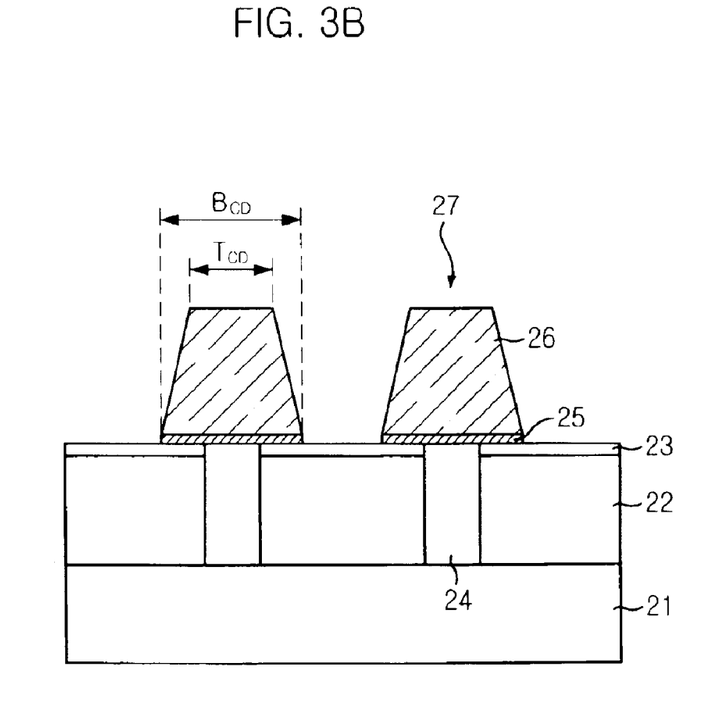

Referring to FIG. 3B, a second etch barrier layer 25 made of polysilicon or titanium nitride (TiN) is formed on the storage node contact plug 24 and the first etch barrier layer 23. At this time, the second etch barrier layer 25 is deposited to a thickness ranging from about 300 Å to about 1000 Å. Thereafter, the first storage node insulation layer 26 is formed on the second etch barrier layer 25. At this time, the first storage node insulation layer 26 is made of a nitride-based material, e.g., $Si_3N_4$. The first storage node insulation layer 26 has a thickness ranging between about 5000 Å to about 30000 Å.

At this time, the second etch barrier layer 25 acts as a barrier layer against a dry etching process and a subsequent wet etching process performed to the first storage node insulation layer 26.

Next, the first storage node insulation layer 26 is proceeded with a dry etching process so that an etching is stopped at the second etch barrier layer 25 through the use of a mask and etch process. Continuously, the second etch barrier layer 25 is proceeded with a dry etching process so that an etching is stopped at the first etch barrier layer 23. From these dry etching processes, a pillar-type pattern 27 of which bottom region has a wider CD compared to the CD of a top region is formed. Also, the pillar-type pattern 27 is contacted to the storage node contact plug 24.

Figure 3C:
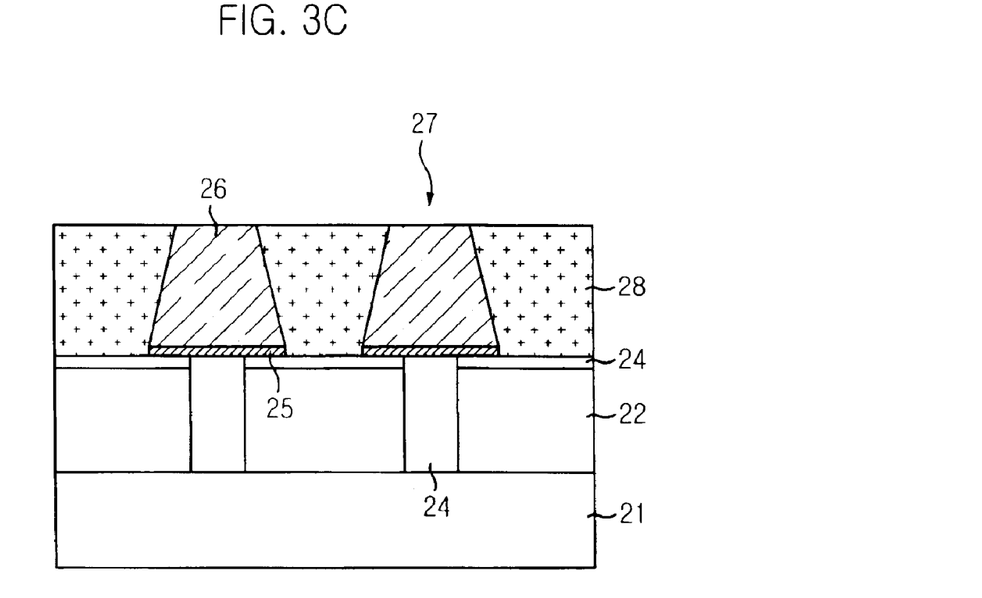

With reference to FIG. 3C, a second storage node insulation layer 28 is formed on the pillar-type pattern 27 until filling up a space between the pillar-type patterns 27. Thereafter, a CMP process is performed to planarize the second storage node insulation layer 28 until a surface of the first storage node insulation layer 26 of the pillar-type pattern 27 is exposed. Herein, the second storage node insulation layer 28 uses any one material selected from a group consisting of undoped silicate glass (USG), phosphorus silicate glass (PSG), born phosphorus silicate glass (BPSG) and plasma enhanced tetra-ethyl-ortho silicate (PETEOS).

Figure 3D:
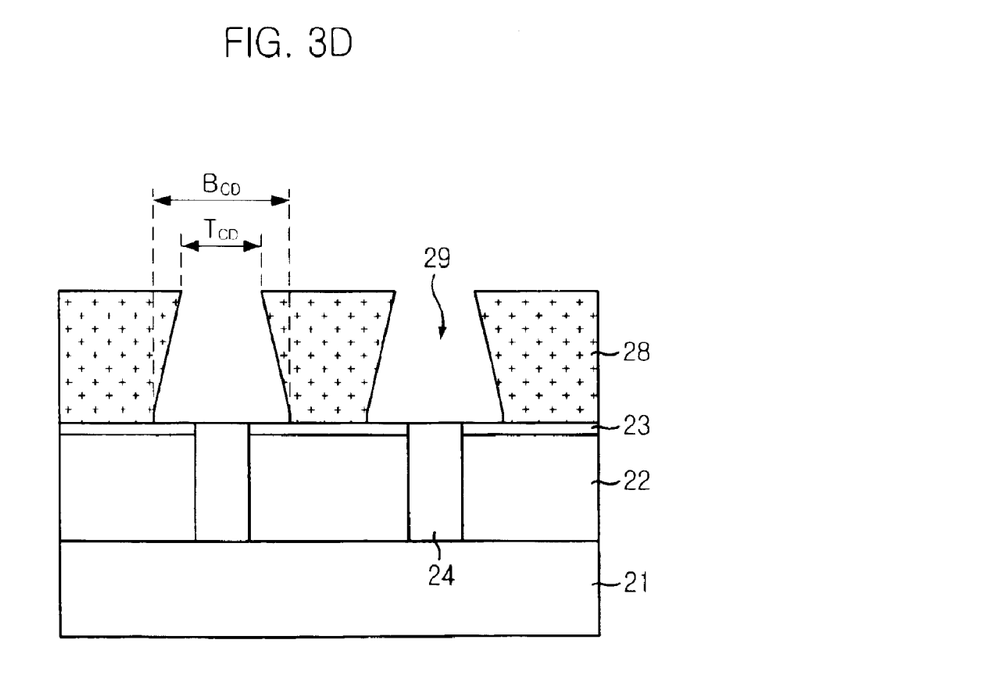

Referring to FIG. 3D, the pillar-type pattern 27 is selectively removed. For the removal of the pillar-type pattern 27, the first storage node insulation layer 26 is firstly proceeded with a wet etching process with use of phosphoric acid $H_3PO_4$ solution and then a dry etching process. At this time, the second etch barrier layer 25 is the etch barrier layer against the wet etching process with respect to the first storage node insulation layer 26, and the first etch barrier layer 23 is the etch barrier layer against the dry etching process with respect to the second etch barrier layer 25.

In the meantime, the second etch barrier layer 25 can be removed with use of the wet etching process. In case that the second etch barrier layer 25 is a polysilicon layer, a mixture solution of nitric acid/hydrofluoric acid/ethanoic acid ($HNO_3$/HF/$CH_3COOH$) is used for the wet etching process. In case that the second etch barrier layer 25 is a titanium nitride layer, a mixture solution of sulfuric acid/hydrogen peroxide ($H_2SO_4$/$H_2O_2$) is used for the wet etching process.

After removing the pillar-type pattern 27, a concave pattern 29 provided from the second storage node insulation layer 28 is formed. Herein, the concave pattern 29, which is a region for a storage node exposing the storage node contact plug 24 has a CD wider at a bottom region than at a top region.

Figure 3E:
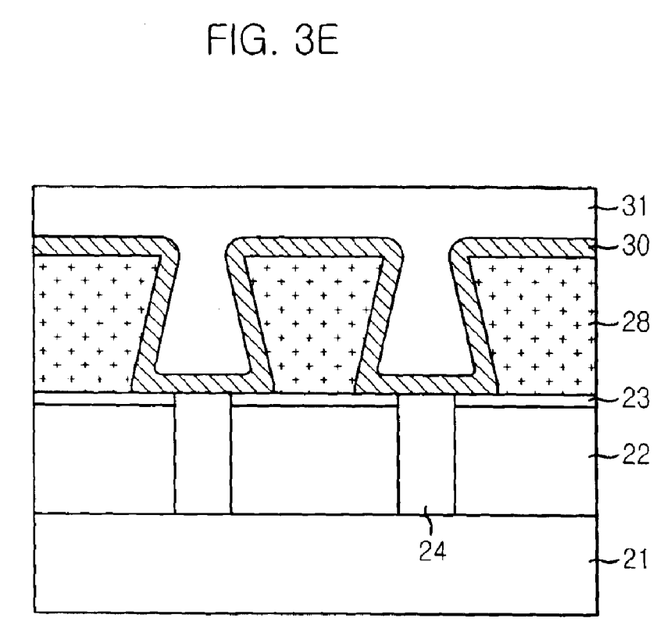

As illustrated in FIG. 3E, a conductive layer for a lower electrode 30 (hereinafter referred to as lower electrode conductive layer) is deposited on the second storage node insulation layer 28 including the concave pattern 29. Then, a photosensitive layer 31 is coated on the lower electrode conductive layer 30 with a thickness that fills up the concave pattern 29. At this time, the lower electrode conductive layer 30 uses doped polysilicon layer or a noble metal-based metal layer.

Figure 3F:
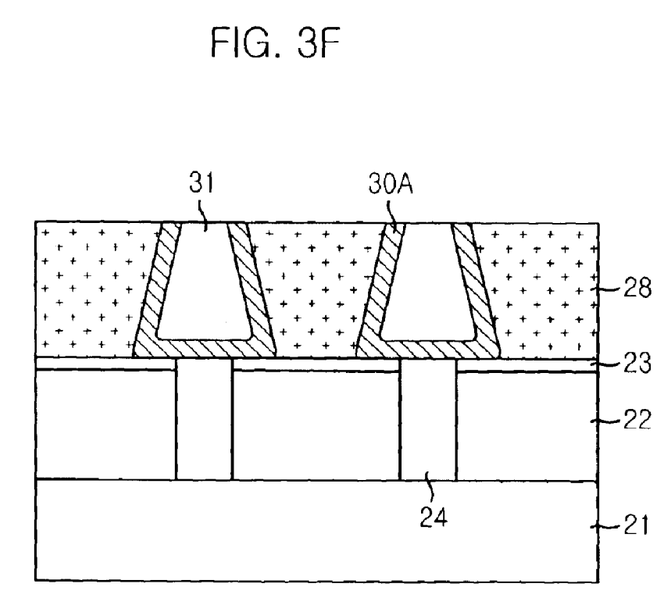

Referring to FIG. 3F, an etch-back or a CMP process to the lower electrode conductive layer 30 is performed to form a cylindrical lower electrode 30A remaining solely within the concave pattern 29.

More specifically, the photosensitive layer 31 is proceeded with the etch-back process until a surface of the lower electrode conductive layer 30 is exposed, and the lower electrode conductive layer 30 exposed on the second storage node insulation layer 28 is proceeded with the etch-back process or the CMP process to form the cylindrical lower electrode 30A.

Figure 3G:
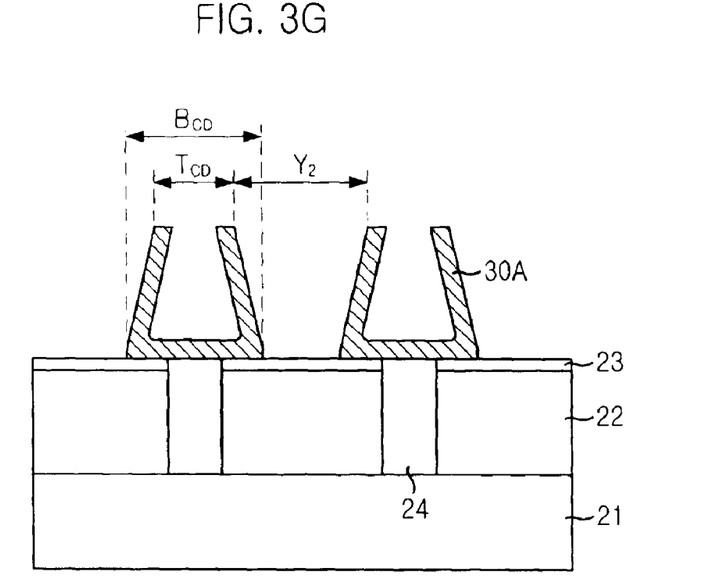

Referring to FIG. 3G, the remaining photosensitive layer 31 is removed through a strip process. Afterwards, a wet etching process is performed to the second storage node insulation layer 28 by using hydro fluoric acid (HF) or a buffered oxide etchant (BOE). At this time, outer walls of the cylindrical lower electrode 30A are exposed.

As described above, since the cylindrical lower electrode 30A is formed inside of the concave pattern 29, a CD of a bottom region ($B_{CD}$) is wider than that of a top region ($T_{CD}$). Therefore, the lower electrode 30A can be firmly supported, further resulting in a wider space $Y_2$ between the lower electrodes 30A.

Figure 3H:
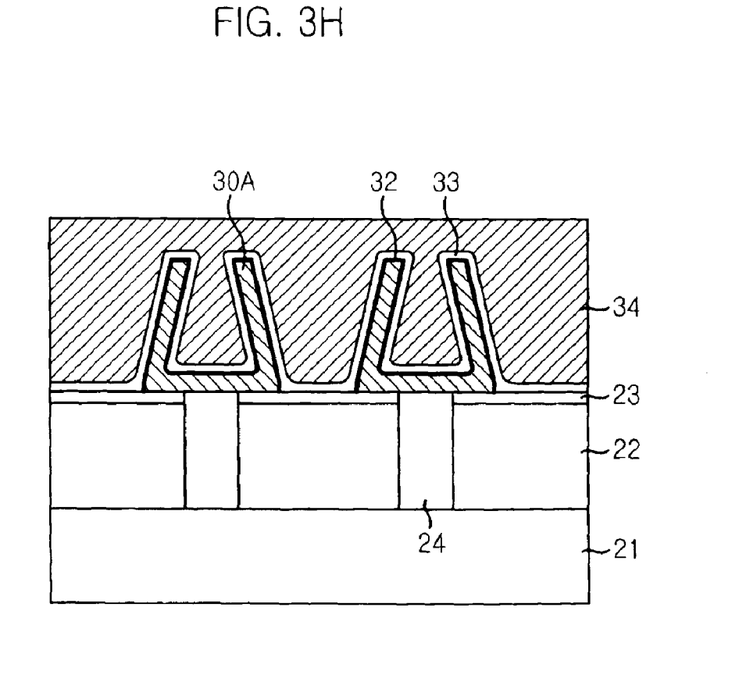

With reference to FIG. 3H, a surface of the lower electrode 30A is nitridated through an ammonia ($NH_3$) plasma treatment so that an oxygen barrier layer 32 preventing diffusions of oxygen into the lower electrode 30A during a heat treatment of a subsequent dielectric layer. At this time, the nitridation process is performed at a temperature ranging from about 300° C. to about 500° C. and a pressure ranging from about 0.1 torr to about 10 torr by supplying a radio frequency (RF) power ranging from about 100 W to about 1000 W.

On top of the nitridated lower electrode 30A, a titanium oxide ($Ta_2O_5$) layer 33 is deposited to a thickness in a range from about 20 Å to about 100 Å. At this time, the deposition of the $Ta_2O_5$ layer 33 is proceeded at a temperature ranging from about 300° C. to about 500° C. and a pressure ranging from about 0.1 torr to about 1 torr by using a source of $Ta(C_2H_5O)_5$ and a reaction gas of $O_2$.

For enhancing properties and crystallization of the $Ta_2O_5$ layer 33 and, the $Ta_2O_5$ layer 33 is proceeded with a heat treatment using a furnace. The heat treatment is performed at a temperature ranging from about 500° C. to about 800° C. in an ambient of $N_2O$ or $O_2$.

Next, after an upper electrode 34 is deposited, a patterning process is performed to thereby form a capacitor. At this time, the upper electrode 34 includes a TiN layer deposited through a chemical vapor deposition (CVD) and a polysilicon layer deposited on the TiN layer. Afterwards, an activation heat treatment is performed by using a furnace at a temperature ranging from about 500° C. to about 700° C. in an atmosphere of nitrogen.

Compared to the CD at the top region of the lower electrode, the CD at the bottom region is wider, and thereby being capable of supporting the lower electrode firmly. Also, a wider distance between the lower electrodes prevents neighboring lower electrodes from contacting to each other. As a result of these effects, it is possible to prevent a failure of dual bit, which eventually results in higher yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor for use in a semiconductor device, comprising the steps of:
    forming a stack layer sequentially deposited in an order of an inter-layer insulation layer and a first etch barrier layer on a substrate, wherein a hole exposing a partial portion of the substrate passing through the inter-layer insulation layer and the first etch barrier layer is formed;
    forming a storage node contact plug contacted to the partial portion of the substrate by being buried into the hole;
    forming a storage node insulation layer on the stack layer, the storage node insulation layer having a concave pattern of which bottom region has a wider critical dimension (CD) than that of a top region and exposing the storage node contact plug, wherein the step of forming a storage node insulation layer comprises the step of:
        depositing a second etch barrier layer and a first storage node insulation layer on the storage node contact plug to form a pillar-type pattern of which bottom region has a wider critical dimension (CD) than that of a top region;
        forming a second storage node insulation layer encompassing the pillar-type pattern;
        removing selectively the pillar-type pattern with use of the first etch barrier layer as an etch barrier layer to expose the storage node contact plug as simultaneously as to form a concave pattern having an inverted shape of the pillar-type pattern;
    forming a lower electrode inside of the concave pattern, the lower electrode being connected to the storage node contact plug; and
    forming sequentially a dielectric layer and an upper electrode on the lower electrode.

2. The method as recited in claim 1, wherein the step of forming the concave pattern by selectively removing the pillar-type pattern includes the steps of:
    etching the first storage node insulation layer by using the second etch barrier layer as an etch barrier layer; and
    etching the second etch barrier layer by using the first etch barrier layer as an etch barrier layer.

3. The method as recited in claim 2, wherein the first storage node insulation layer and the second etch barrier layer are etched through the use of a wet etching process.

4. The method as recited in claim 2, wherein the first storage node insulation layer is etched through the use of a wet etching process and the second etch barrier layer is etched through the use of a dry etching process.

5. The method as recited in claim 1, wherein the first storage node insulation layer and the first etch barrier layer are nitride layers and the second etch barrier layer is a polysilicon layer.

6. The method as recited in claim 5, wherein the first storage node insulation layer is proceeded with the wet etching process by using a solution of phosphoric acid ($H_3PO_4$), and the second etch barrier layer is proceeded with the wet etching process by using a mixture solution of nitric acid/hydrofluoric acid/ethanoic acid ($HNO_3$/HF/$CH_3COOH$).

7. The method as recited in claim 1, wherein the first storage node insulation layer and the first etch barrier layer are nitride layers and the second etch barrier layer is a titanium nitride layer.

8. The method as recited in claim 7, wherein the first storage node insulation layer is proceeded with the wet etching process by using a solution of $H_3PO_4$ and the second etch barrier layer is proceeded with the wet etching process by using a mixture solution of sulfuric acid/hydrogen peroxide ($H_2SO_4$/$H_2O_2$).

9. The method as recited in claim 1, wherein the step of forming the lower electrode further includes the step of nitridating a surface of the lower electrode.

10. A method for fabricating a capacitor of a semiconductor device, comprising the steps of:
    forming a stack layer by depositing sequentially an inter-layer insulation layer and a first etch barrier layer on a substrate;
    forming a storage node contact hole exposing a partial portion of the substrate by etching the stack layer;
    forming a storage node contact plug connected to the substrate by being buried into the storage node contact hole;
    depositing a second etch barrier layer and a first storage node insulation layer on the storage node contact plug and the stack layer;
    performing a dry etching process to the first storage node insulation layer and the second etch barrier layer to form a pillar-type pattern of which bottom region has a wider critical dimension (CD) than that of a top region on the storage node contact plug;
    forming a second storage node insulation layer encompassing the pillar-type pattern;
    removing selectively the pillar-type pattern to form a concave pattern exposing the storage node contact plug;
    forming a lower electrode inside of the concave pattern, the lower electrode being connected to the storage node contact plug and having a wider critical dimension at its bottom region than at its top region; and forming sequentially a dielectric layer and an upper electrode on the lower electrode.

11. The method as recited in claim 10, wherein the step of forming the concave pattern by selectively removing the pillar-type pattern includes the steps of:

etching the first storage node insulation layer with use of the second etch barrier layer as an etch barrier layer; and etching the second etch barrier layer with use of the first etch barrier layer as an etch barrier.

12. The method as recited in claim 11, wherein the first storage node insulation layer and the second etch barrier layer are etched by employing a wet etching process.

13. The method as recited in claim 11, wherein the first storage node insulation layer is etched through the use of a wet etching process and the second etch barrier layer is etched through the use of a dry etching process.

14. The method as recited in claim 11, wherein the first storage node insulation layer and the first etch barrier layer are nitride layers and the second etch barrier layer is a polysilicon layer.

15. The method as recited in claim 14, wherein the first storage node insulation layer is proceeded with the wet etching process by using a solution of $H_3PO_4$, and the second etch barrier layer is proceeded with the wet etching process by using a mixture solution of $HNO_3/HF/CH_3COOH$.

16. The method as recited in claim 11, wherein the first storage node insulation layer and the first etch barrier layer are nitride layers and the second etch barrier layer is a titanium nitride layer.

17. The method as recited in claim 16, wherein the first storage node insulation layer is proceeded with the wet etching process by using a solution of $H_3PO_4$ and the second etch barrier layer is proceeded with the wet etching process by using a mixture solution of $H_2SO_4/H_2O_2$.

* * * * *